United States Patent
Sieg

(10) Patent No.: US 12,123,229 B2
(45) Date of Patent: Oct. 22, 2024

(54) DEVICE FOR A VEHICLE TO DETECT AN ACTIVATION ACTION IN AT LEAST TWO DIFFERENT DETECTION AREAS

(71) Applicant: Huf Hülsbeck & Fürst GmbH & Co. KG, Velbert (DE)

(72) Inventor: Berthold Sieg, Bottrop (DE)

(73) Assignee: Huf Hülsbeck & Fürst GmbH & Co. KG, Velbert (DE)

( * ) Notice: Subject to any disclaimer, the term of this patent is extended or adjusted under 35 U.S.C. 154(b) by 217 days.

(21) Appl. No.: 17/779,757

(22) PCT Filed: Nov. 27, 2020

(86) PCT No.: PCT/EP2020/083704
§ 371 (c)(1),
(2) Date: May 25, 2022

(87) PCT Pub. No.: WO2021/105406
PCT Pub. Date: Jun. 3, 2021

(65) Prior Publication Data
US 2023/0003059 A1   Jan. 5, 2023

(30) Foreign Application Priority Data
Nov. 27, 2019 (DE) ...................... 10 2019 132 136.0

(51) Int. Cl.
*E05B 81/78* (2014.01)
(52) U.S. Cl.
CPC ................... *E05B 81/78* (2013.01)
(58) Field of Classification Search
CPC .......... E05B 81/78; E05B 81/64; E05B 85/16; E05B 77/34; H03K 2017/9602;
(Continued)

(56) References Cited

U.S. PATENT DOCUMENTS

2003/0107473 A1   6/2003   Pang et al.
2010/0324845 A1*  12/2010  Spanier .............. G01R 19/2513
                                                         702/62
(Continued)

FOREIGN PATENT DOCUMENTS

DE         10212794 A1    6/2003
DE         10262353 B4    2/2015
WO      WO2018177580 A1  10/2018

OTHER PUBLICATIONS

Second Office Action for Chinese Application No. 202080075219.1 mailed on Aug. 23, 2023, with its English Translation, 9 pages.
(Continued)

*Primary Examiner* — Vernal U Brown
(74) *Attorney, Agent, or Firm* — Christian Hans; Bret E. Field; Bozicevic, Field & Francis LLP

(57) ABSTRACT

This disclosure relates to a device for a vehicle for detecting an activation action in at least two different detection areas, and in particular for mounting on a vehicle part to activate at least one function of the vehicle as a function of the detection, including a printed circuit board having a plurality of layers arranged one above the other in an axial direction, a first electrically conductive sensing element for capacitive sensing in a first of the detection areas, a second electrically conductive sensing element for capacitive sensing in a second of the detection areas, where the sensor elements are arranged at different ones of the layers of the printed circuit board, characterized in that in that the sensor elements are configured to be at least partially congruent, the congruent areas of the sensor elements being positioned offset with respect to one another in a lateral direction.

21 Claims, 8 Drawing Sheets

Figure 2:
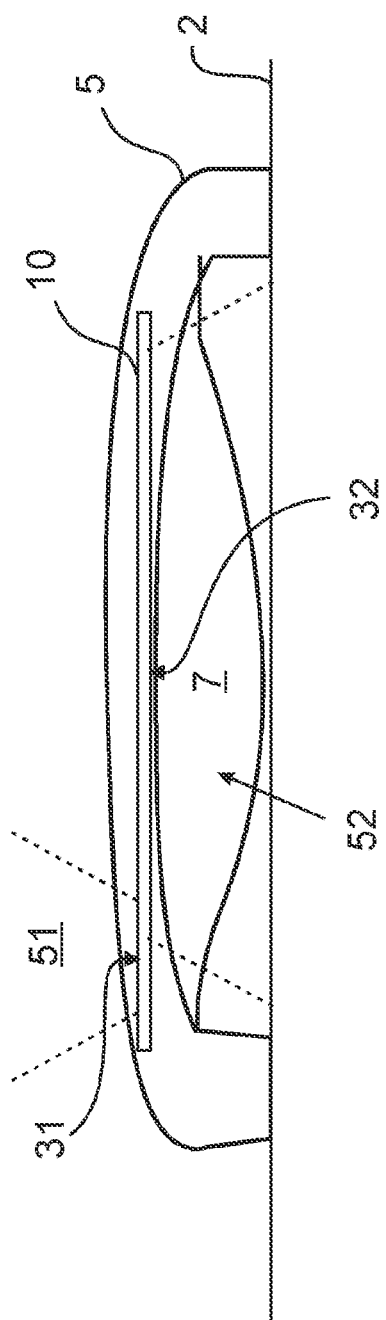

(58) Field of Classification Search
CPC ... H03K 2217/960765; E05F 2015/765; E05F 15/73; B60R 25/1001
See application file for complete search history.

(56) References Cited

U.S. PATENT DOCUMENTS

2011/0001549 A1\* 1/2011 Van Gastel .......... H03K 17/962
 327/517
2013/0033362 A1 2/2013 Hourne
2021/0173113 A1\* 6/2021 Sieg ..................... E05B 81/77
2022/0352890 A1\* 11/2022 Stahl .................... E05B 81/77

OTHER PUBLICATIONS

First Office Action for Chinese Application No. 202080075219.1 mailed Feb. 15, 2023, with its English translation, 17 pages.

\* cited by examiner

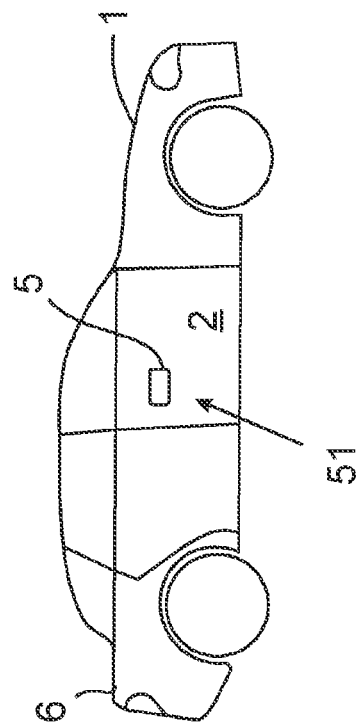
Fig. 1
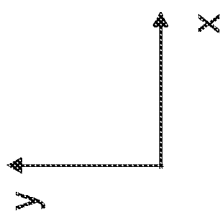

DEVICE FOR A VEHICLE TO DETECT AN ACTIVATION ACTION IN AT LEAST TWO DIFFERENT DETECTION AREAS

The present invention relates to a device according to a device further defined in the generic term of the present disclosure. Furthermore, the invention relates to a door handle with the device.

It is known from the prior art that activation actions of a user can be used in vehicles to activate functions of the vehicle. Such an activation action can be, for example, the approach of a hand to the door handle of the vehicle in order to perform an unlocking and/or locking of the vehicle.

To detect this activation action, proximity sensors such as capacitive sensors are often integrated into the door handle of the vehicle.

It is also possible that multiple sensors are provided to monitor different detection areas in which the activation action can be performed. However, one problem here may be that the detection of the sensors may interfere with each other. For example, a first activation action in a first detection area of a first sensor may also—undesirably—influence the detection of a second sensor in a second detection area.

It is therefore an object of the present invention to at least partially eliminate the disadvantages described above. In particular, it is an object of the present invention to enable an improved and, in particular, more reliable detection of such activation actions.

The foregoing problem is solved by a device having the features of the present disclosure and by a door handle having the features of the present disclosure. Further features and details of the invention result from the present disclosure, the description and the drawings. In this context, features and details described in connection with the device according to the invention naturally also apply in connection with the door handle according to the invention, and vice versa in each case, so that reference is or can always be made mutually with regard to the disclosure concerning the individual aspects of the invention.

The object is solved in particular by a device for a vehicle for detecting (at least) one activation action in at least two different detection areas, and in particular for mounting onto a vehicle part. The detection of the (at least one) activation action can be used to activate at least one and preferably two different function(s) of the vehicle depending on the detection.

The mounting on the vehicle part can advantageously be done for this purpose, in order to let the detection areas arise in the area of this vehicle part. The vehicle part is, for example, a door handle according to the invention, in which the device is accommodated, or also a door or flap or a bumper or a door sill of the vehicle.

The detection of a (first) activation action in the first detection area may further serve to activate a (first) function of the vehicle depending on the detection. It may also be provided that a (second) activation action is detected in the second detection area to activate at least one (second or further) function of the vehicle, in which case the functions may differ from each other. The activatable (first and/or at least second) function of the vehicle is, for example, at least one of the following:
 a locking of the vehicle,
 an unlocking of the vehicle,
 the initiation of an opening and/or closing movement of a movable part of the vehicle, in particular a front or rear or side flap (such as a side door or trunk lid) of the vehicle, the movement preferably being motorized,
 the activation of a vehicle lighting,
 the initiation of authentication at the vehicle.

The first and at least second function can also be different functions. Thus, it is possible, for example, that the detection of the first activation action triggers the activation of a different function of the vehicle than the detection of the second activation action. For example, the detection of an approach to a first outer side of the door handle (as the first activation action) can trigger the locking and the detection of an approach to a second outer side of the door handle (as the second activation action) can trigger the unlocking. The second outer side may face a door handle recess and the first outer side may face away from the door handle recess (or vice versa). This enables convenient and simple operation of the functions for a user of the vehicle.

A device according to the invention may further comprise components mentioned below:
 a (multilayer) printed circuit board having a plurality of layers, the layers preferably being arranged one above the other in an axial direction—in particular fastened to one another, preferably glued to one another,
 a first electrically conductive sensing element for capacitive sensing in a first of the detection areas (i.e., a first detection area),
 a second electrically conductive sensing element for capacitive sensing in a second of the detection areas (i.e., a second detection area).

It can be provided that the sensor elements are arranged on different layers of the printed circuit board. It is advantageous if the sensor elements are at least partially congruent (i.e. each with a congruent area), the congruent areas of the sensor elements being positioned offset from one another in a lateral direction x (i.e. in particular with respect to their position on the respective layer). This has the advantage that a disturbance caused by the capacitive detection of the first sensor element to the capacitive detection of the second sensor element and/or vice versa can at least be reduced. The activation action in the first detection area thus only has an at least reduced influence on the detection of the second sensor element in the second detection area, and/or vice versa.

The sensor elements can be completely congruent, so that the congruent areas correspond to the complete sensor element. However, it is advantageous if one of the sensor elements (e.g. the second sensor element) has a different design/configuration, e.g. a longer extension, than the other sensor element (e.g. the first sensor element). In this case, at least one of the congruent regions may correspond to only a partial region of the associated sensor element. If, according to this example, the sensor elements have an extension of different lengths, the congruent region of the shorter sensor element may also correspond to the complete (shorter) sensor element. On the other hand, the congruent area of the longer sensor element may only correspond to the partial (longer) sensor element.

In the context of the present invention, three mutually orthogonal directions x, y, z can be defined, namely two mutually orthogonal lateral directions x and y, as well as an axial direction z which is likewise orthogonal to these directions. In particular, the lateral directions x and y define a plane in which positioning of electronic components and conductor tracks on a single layer of the printed circuit board is possible. The design/configuration of the printed circuit board as a multilayer printed circuit board enables a compact and space-saving construction for the device.

The respective sensor element may be suitable for capacitive sensing in that it can provide an electric field (with appropriate electrical actuation), and/or in that it provides a variable capacitance with respect to the environment of the vehicle and/or in interaction with an electrical ground or counter electrode of the vehicle, which is dependent on the environment. The electrical control of the respective sensor element may be performed by a processing device (such as a microcontroller, integrated circuit or the like) of the device according to the invention, for example by repeated charge transfers. In addition to the first and second sensor elements, further sensor elements may also be provided, which are also operated according to the aforementioned principle.

To improve detection, at least two shielding elements can be provided for shielding the detection of the first and/or second sensor element. In particular, it is provided that the shielding elements are arranged at different layers of the printed circuit board. In this case, one of the shielding elements can be arranged at a first layer (of the different layers of the printed circuit board) and/or can (spatially and in particular predominantly or completely) surround the first sensor element at the first layer, preferably in order to provide the shielding in different directions.

The multilayer design/configuration of the printed circuit board has the further advantage that the shielding elements can be arranged on several layers, thus enabling a three-dimensional arrangement of the shielding elements. This allows the shielding to be adapted particularly flexibly to a detection area and the structure for at least one of the sensor elements. The concrete three-dimensional formation of the shielding elements on the printed circuit board further enables the shielding to be adjusted in such a way that the different directions in which the shielding is to take place are defined. Thus, the shielding can also be generated three-dimensionally by the shielding elements, and according to a particular advantage, in a pot-shaped manner. Thus, the shielding can affect a limitation of the capacitive detection to the detection area in a particularly reliable manner. Furthermore, the shielding elements can, if necessary, be arranged on the printed circuit board in such a way that a geometrical adaptation and, in particular, alignment of the shielding to the detection area of at least one of the sensor elements takes place. For example, the geometric shape of the shielding is at least partially adapted to and/or corresponds at least partially to the geometric shape of the associated detection area.

The shielding can be provided by the shielding elements for the first sensor element, but optionally also additionally for the second sensor element of the device according to the invention. If the detection areas of the sensor elements differ, the associated shields for the different sensor elements also differ accordingly. Separate shielding elements may be provided on the printed circuit board for each of these different shields. Also, it may be provided that at least one of the shielding elements serves for generating the shielding for more than one of the sensor elements.

The shielding element at the first layer is also referred to as a first shielding element in the following for easier assignment, although a second shielding element can also be provided at the second layer and/or a third shielding element at the third layer and/or a fourth shielding element at the fourth layer. The shielding elements may be electrically connected to each other across layers, thus forming a single shielding element. The respective shielding element is provided in particular in the form of an electrically conductive surface and/or conductor track of the printed circuit board, and the electrical connection of the shielding elements is provided in particular as a through-hole plating of the printed circuit board.

It is also possible for the respective sensor element to be provided in the form of an electrically conductive surface and/or conductor track on the printed circuit board. In this case, the sensor elements can have a thickness in the range from 0.1 mm to 0.9 mm, for example.

A multilayer printed circuit board (so-called "multilayer PCB") can further have the benefit of increasing the packing density, and/or improving the generation of electric and/or magnetic fields. In particular, if more than one detection area is provided, possibly for different sides of the device, and/or near-field communication is additionally provided by the device, the use of multiple layers can simplify the alignment of the fields for sensing and/or shielding and/or for communication. The individual layers of the printed circuit board may also be referred to as layers (German: Lagen). The multilayer printed circuit board may have at least or exactly 4 layers which are firmly connected to each other.

The device according to the invention can be designed/configured as a sensor and/or communication device. This makes it possible for the device, and in particular the printed circuit board, to have several electronic components which serve both for detection in the detection areas and for communication, in particular near-field communication. Thus, the device can provide a compact and individually manageable module that can conveniently provide multiple functions for a door handle. Specifically, the communication may involve radio communication or wireless communication, so that corresponding communication fields (electric and/or magnetic fields) are generated here. Therefore, the different fields for sensor detection and communication can also interfere with each other, so that additional measures such as reliable shielding or a specific structure of the sensor elements are then necessary.

The device according to the invention may be configured to provide at least one of the following functions:
  a detection of at least one activation action, such as an approach and/or touch and/or gesture and/or tactile actuation by a user, wherein the detection of the activation action is distinguished in the first or second detection area,
  a communication, preferably radio communication, such as near-field communication, in particular with a mobile device such as an ID transponder and/or smartphone and/or the like, preferably for authentication,
  an activation of at least one vehicle function, in particular a safety-relevant vehicle function such as an unlocking and/or locking device, or a movement of a movable part of the vehicle, such as a flap, as a function of the detection, the selection of the activated function preferably being dependent on in which of the detection areas the detection of the activation action takes place.

The device according to the invention can further be designed/configured as an individually manageable module which can be mounted as a single component on the vehicle and/or vehicle part. For this purpose, the device may have positioning elements/means such as recesses or geometric adaptations which enable unambiguous attachment to the vehicle. The positioning element may simultaneously or alternatively be designed/configured as fastening element such as latching elements or clips or adhesive elements. The device may be mounted to a part of the vehicle such as a door and/or a door handle and/or a tailgate and/or a front flap. For mounting, for example, the fastening can be done by means of the fastening element and the positioning can be done by means of the positioning element.

The device according to the invention can advantageously be integrated into a door handle of the vehicle, preferably an outer door handle of the vehicle. Thus, the device may be designed/configured to perform the communication and/or the detection in the area of the door handle. The device can be mounted for integration in the door handle, in order to be mounted in this way via the door handle on the vehicle, in particular on a door of the vehicle.

It is also advantageous if the vehicle is designed/configured as a motor vehicle, preferably a passenger vehicle, in particular as a hybrid vehicle or as an electric vehicle, preferably with a high-voltage electrical system and/or an electric motor and/or an internal combustion engine. Furthermore, it may be possible for the vehicle to be designed/configured as a fuel cell vehicle and/or semi-autonomous or autonomous vehicle.

Advantageously, the vehicle has a security system that enables authentication, for example, by communicating with a mobile device such as an identification transmitter (ID transmitter, electronic key) or smartphone. Depending on the communication and/or authentication, (the) at least one function of the vehicle can be activated. If the authentication of the mobile device is necessary for this purpose, the function may be a safety-related function, such as an unlocking of the vehicle or an enabling of an engine start. Thus, the security system can also be designed/configured as a passive access system that initiates authentication and/or activation of the function upon detection of the approach of the mobile device to the vehicle without active manual actuation of the mobile device. For this purpose, for example, a wake-up signal is repeatedly transmitted by the security system, which can be received by the mobile device when it approaches and then triggers authentication. Likewise, the approach can be detected by the activation action being detected by a device according to the invention. Also, the function may involve an activation of a vehicle light and/or an actuation (opening and/or closing) of a flap (e.g., front or rear or side flap or door). For example, the vehicle lighting is automatically activated upon detection of approach and/or the flap is actuated upon detection of a gesture by a user. The mobile device can be designed/configured separately from the vehicle and, for example, be suitable for being carried by a person (e.g., in a pocket).

The respective sensor element can be designed/configured as a capacitive sensor, so that the detection is based on the fact that a capacitance provided by the sensor element changes. The individual sensor element can be regarded as an electrode that forms the variable capacitance relative to the vehicle's environment. A discrete counter-electrode does not necessarily have to be provided for this purpose. For example, an electrical ground potential of the vehicle can also be regarded as a counter-electrode to form an imaginary capacitor with the variable capacitance. A first activation action in the first detection area then causes a capacitance change of the capacitance provided by the first sensor element. A second activation action in the second detection area accordingly causes a capacitance change of the capacitance provided by the second sensor element.

The second sensor element can be at least partially congruent with the first sensor element. Furthermore, the second sensor element and the first sensor element may be arranged (offset from each other) on different layers of the printed circuit board. In addition to being arranged (offset in axial direction) on different layers, the sensor elements may be positioned (offset in lateral direction) on (within) the respective layer. The offset positioning thus refers to a different positioning of the sensor elements within the plane of the respective layer, so that the sensor elements do not overlap. Thus, although the sensor elements are designed/configured to be congruent per se, they do not lie congruently on top of each other. In this way, an influence of the first activation action on the detection of the second sensor element (and/or vice versa) can at least be reduced.

It is also conceivable that the sensor elements each have a substructure that is repeated at least at a certain minimum distance in the lateral direction x, with the mutually offset positioning of the sensor elements preferably taking place in the same lateral direction x. By "repeat at least at a certain minimum distance . . . " it can be understood here that the substructures can be arranged repeatedly at a fixed distance—but alternatively also at different distances—with the fixed and different distances corresponding at least to the minimum distance. The partial structure can also be repeated in a further lateral direction y, i.e. orthogonal to the lateral direction x. The staggered structuring of the sensor elements makes it possible for the electric fields of the sensor elements to influence each other less.

It can be provided within the scope of the invention that the mutually offset positioning of the sensor elements is provided with a certain offset, which corresponds at most to half of the minimum distance of the substructures. Thus, the sensor elements continue to be positioned one above the other (in the axial direction), but offset from each other (possibly within the distance or minimum distance) in the lateral direction. In an imaginary top view of the sensor elements (in the axial direction), one sensor element would at least partially overlap the other sensor element if not offset. However, this overlapping is (at least partially) eliminated in the provided offset positioning. For example, the sensor elements each have the same line structure, whereby the lines do not overlap due to the offset arrangement.

Furthermore, it can be advantageous within the scope of the invention that the offset positioning is implemented as a different positioning of the sensor elements within the respective layer or plane of the layer, so that an overlapping of the sensor elements is prevented, and in particular electric fields generated by the sensor elements are formed offset. In particular, the spatial proximity of the electric fields to one another can be problematic in this case, whereby the fields can be formed one above the other in the axial direction. The arrangement of the sensor elements or the associated substructures one above the other provided in the axial direction can be predetermined in this case, if necessary, by the arrangement of the detection areas. The invention is based on the consideration that although the arrangement provided one above the other cannot be prevented, a staggered arrangement of the substructures can reduce the mutual interference of the fields.

It is also optionally conceivable that the congruent areas of the sensor elements have substructures of identical design/configuration, in particular in the form of a line structure. The congruent areas can thus have the likewise congruently formed partial structures, which are arranged repeatedly, for example, in the manner of a line structure. Such a partial structure can have the advantage that an electromagnetic interaction such as an induction of eddy currents is reduced.

It is further conceivable that with regard to the lateral direction (i.e. in particular on a common projection plane in the case of an orthogonal parallel projection of the respective layers in the axial direction as projection direction) the substructures, in particular the lines, of the second sensor element are arranged between the substructures, in particular the lines, of the first sensor element. In other words, the offset positioning is achieved by arranging the partial structures offset from each other. In this way, an influence of the substructures of the first sensor element on the substructures of the second sensor element can be reliably reduced. An overlapping of the substructures thus does not take place.

A line structure can be understood as a geometric structure in which several branches (the lines) are arranged parallel to each other. The branches can (only) be connected to each other via a common conductor track. The branches can be perpendicular to the conductor path, possibly also in different directions. The lines can be arranged next to each other as a partial structure at a certain distance or minimum distance from each other.

According to a further advantage, it can be provided that the second sensor element has a longer extension than the first sensor element, so that the second detection area is designed/configured to be larger than the first detection area. This makes it possible, for example, for a larger spatial area to be available for the activation action in the second detection area, in particular in a door handle recess.

In a further possibility, it can be provided that a shielding element is provided on a second layer of the printed circuit board, and has at least partially a congruent design/configuration with the first sensor element on a first layer of the printed circuit board and/or at least partially with the second sensor element on a further, in particular fourth, layer of the printed circuit board, and is preferably positioned in the lateral direction in the same position as the first sensor element and offset with respect to the second sensor element. In other words, in a plan view (in the axial direction), the first sensor element at the first layer and the shielding element at the second layer may overlap (at least partially or predominantly or completely). The shielding element at the second layer can also be arranged in the same position as the first sensor element at the first layer, i.e. not offset, so that the shielding element completely covers the first sensor element, in particular in the top view. Accordingly, the shielding element at the second layer can also be designed/configured with the same geometric configuration, in particular partial and preferably linear structure, of the first sensor element. This shielding element then creates a shielding that reduces a disturbing influence of the electrical ground at the second layer.

In a further possibility, it can be provided that an electrical ground extends areally at the second layer adjacent to the shielding element at the second layer, in particular parallel and/or opposite to an area for the arrangement of electronic components at the first layer and/or to one of the shielding elements at a third layer. Alternatively or additionally, the ground may extend as a conductive surface (correspondingly planar) over the second layer, but may have a recess in an area opposite the sensor element at the first layer. In this recess, for example, the (second) shielding element can be arranged on the second layer. In contrast, the area of the ground can be continuous with respect to the area for arranging electronic components.

Furthermore, it is conceivable that a processing device is arranged on the printed circuit board and is electrically connected to the sensor elements for charge transfers in order to evaluate a variable electrical capacitance of the respective sensor element on the basis of the charge transfers and thereby provide the respective capacitive detection. In other words, the capacitive sensing and/or detection may be performed by determining the variable capacitance by the processing device. In particular, the variable electrical capacitance is provided by the respective sensing element and is specific to a change in the detection area. Thus, this capacitive detection can lead to the detection of the activation action. It is also possible that the processing device drives the shielding elements, e.g. also by charge transfers.

In a further possibility, it can be provided that the processing device is designed/configured to perform the detection of the activation action in such a way that an approach and/or a gesture of a user is detected on the basis of the evaluation of the respective capacitance, and a distinction is made between a first activation action in the first detection area and a second activation action in the second detection area. For this purpose, the processing device may, for example, evaluate a change in the respective capacitance, e.g., perform a comparison with a threshold value. If the threshold value is exceeded by the changed capacitance in one of the sensor elements, the activation action can be detected in the detection area of this sensor element. For example, the vehicle function can then be activated, in particular by an electrical signal output of the device, if the detection has occurred positively, i.e., for example, the approach and/or touch and/or actuation and/or gesture has been detected. Depending on in which of the detection areas the activation action was detected, different electrical signals can be output and thus also different vehicle functions can be activated.

Of further advantage, it may be provided that an (electronic) processing device is electrically connected to the shielding elements to operate the (or at least one of the) shielding elements to provide an active shield, wherein an electrical potential of the shielding element(s) is adjusted in dependence on an electrical potential of at least one of the sensor elements. In other words, the electrical potential of the shielding elements tracks the potential of the sensor element.

It is also optionally conceivable that a communication element/means is arranged on the layers of the printed circuit board, and preferably extends over at least 2 or at least 4 or all of the layers and/or (laterally) spaced from the sensor and/or shielding element, to provide near-field communication with a mobile device. In this case, the near-field communication may be provided with the mobile device external to the vehicle. In this case, the vehicle part may be an exterior door handle. For example, the mobile device is designed/configured as a smartphone, which then only needs to be held up to the device or the exterior door handle for authentication in order to enable the near-field communication. Alternatively, the door handle can also be designed/configured as an interior door handle so that near-field communication is carried out in the interior of the vehicle.

The communication element is advantageously suitable for providing or performing near field communication such as NFC (near field communication) or RFID (radio-frequency identification). The communication element is formed, for example, as an antenna, in particular an NFC antenna, which may be provided at least partially on some or all of the layers of the printed circuit board. The parts of the communication element on the different layers can thereby be electrically connected to each other by means of through-hole platings in order to provide a loop (e.g. NFC loop) on several layers as a whole. The communication element thus enables the device according to the invention to provide a communication function in addition to the sensor function. The communication element can be designed/configured as a conductor track, and in particular have a constant distance to an electrical ground area and/or to the sensor and/or shielding elements of the printed circuit board (in lateral direction). The communication element can run along the outer edge of the printed circuit board or layer.

It can be provided that the communication element is used, in particular triggered by a (successful) detection of an activation action, to perform the authentication via the near field communication. For example, a processing device and/or a control unit of the vehicle recognizes that the detection was successful and triggers authentication via the communication element. Thus, depending on the authentication, the function of the vehicle, in particular an unlocking and/or locking of the vehicle, can be activated. For example, a user carries the mobile device with him when he performs the activation action. By performing the activation action, the user makes it clear that he or she wishes to activate the function of the vehicle. However, the function may be a security-related function that requires the user to authenticate via the mobile device. For this reason, the detection of the activation action by the device according to the invention may trigger the authentication process, which is then also provided by the device by means of the communication, in particular near field communication. The processing device and/or the control unit of the vehicle can then also detect the successful authentication and only then activate the function of the vehicle. For communication, a processing arrangement of the device such as an NFC circuit can be controlled by the processing device and/or the control device of the vehicle.

It can be provided that a processing arrangement and/or a processing device are provided in the device according to the invention, which serve individually or together for the evaluation of the acquisition and/or for the detection of the activation action and/or for receiving and/or transmitting in the communication—in particular near field communication. In this context, the processing arrangement and the processing device may be designed/configured as separate microcontrollers and integrated circuits (IC), respectively. For example, the processing device may be dedicatedly used for detection and the processing arrangement may be dedicatedly used for near-field communication. It is also possible that the processing arrangement and the processing device are formed together as one IC. Also, it is a possibility that the processing arrangement is part of the processing device, e.g., a microcontroller or IC. The processing arrangement and/or the processing device can thereby have an interface to further vehicle electronics, in particular an ECU. For example, the processing device may output a signal to the vehicle electronics indicating that detection has successfully taken place. Receiving this signal can in turn trigger authentication, which the vehicle electronics then initiate via a further interface with the processing arrangement.

It is furthermore advantageous if, within the scope of the invention, the first sensor element is formed on a first layer adjacent to the first detection area, and the second sensor element is formed on a further, in particular fourth, layer adjacent to the second detection area, the respective layers preferably being provided as outer layers of the printed circuit board, in order, in particular, to form the detection areas by the sensor elements on different sides of a door handle of the vehicle via the respective variable electrical capacitance of the sensor elements, so that, on the basis of the capacitances, a first activation action in the first detection area is distinguished from a second activation action in the second detection area, in order to activate different functions of the vehicle in accordance with the distinction. This differentiation can be carried out, for example, by a processing device by evaluating the changes in the respective capacitances.

Of further advantage, it can be provided that a communication element is arranged on the layers of the printed circuit board, and preferably extends over all of the layers at a distance from the sensor elements, in order to provide near-field communication with a mobile device outer side the vehicle, and preferably in order to carry out authentication via the near-field communication triggered by the (respective) detection of the activation action, and in order to activate at least one function of the vehicle, in particular unlocking and/or locking of the vehicle, preferably depending on the authentication. The spaced arrangement of the communication element with respect to the sensor elements can thereby be provided with a fixed distance in the lateral direction.

It is also optionally conceivable that the offset positioning of the sensor elements is implemented as a different positioning of the sensor elements in the lateral direction in such a way that a disturbance caused by the capacitive detection of the first sensor element in the first detection area is reduced to the capacitive detection of the second sensor element in the second detection area. Accordingly, the positioning, i.e., for example, the offset of the sensor elements in the lateral direction relative to one another, can be selected such that the interference is reduced. For this purpose, for example, an experimental setup of the device according to the invention can be used in which the offset is successively increased while at the same time the electric fields are generated by the sensor elements. A degree of disturbance can be determined, for example, by measuring the variable capacitances formed by the sensor elements. For example, the disturbance can be measured in the manner of a change in the second capacitance of the second sensor element when an activation action is performed only in the first detection area of the first sensor element. An offset for positioning can then be selected at which the disturbance is minimal.

It is further conceivable that the respective congruent area of the sensor elements has a repeating substructure which is designed/configured to form an electric field for the respective capacitive detection and is preferably aligned and/or arranged in such a way that an interfering interaction with a communication element of the printed circuit board is reduced. The communication element is designed/configured, for example, to generate a near-field communication by means of magnetic fields. Thus, the communication element can in principle induce an electrical eddy current in the sensor elements during operation. The substructure can be designed/configured, for example as a line structure, to at least reduce this induction of eddy currents. The arrangement and/or alignment of the substructures can then be done in a way that reduces or minimizes an attenuation of the communication field provided by the communication element. For this purpose, the alignment and/or arrangement can be changed, for example, and the communication field can be measured or simulated at the same time.

Also an object of the invention is a door handle for a vehicle, wherein the door handle as the vehicle part has a device according to the invention. Thus, the door handle according to the invention brings the same advantages as have been described in detail with reference to a device according to the invention.

A method of manufacturing a device according to the invention and/or a method of operating a device according to the invention may also be protected.

Figure 3:
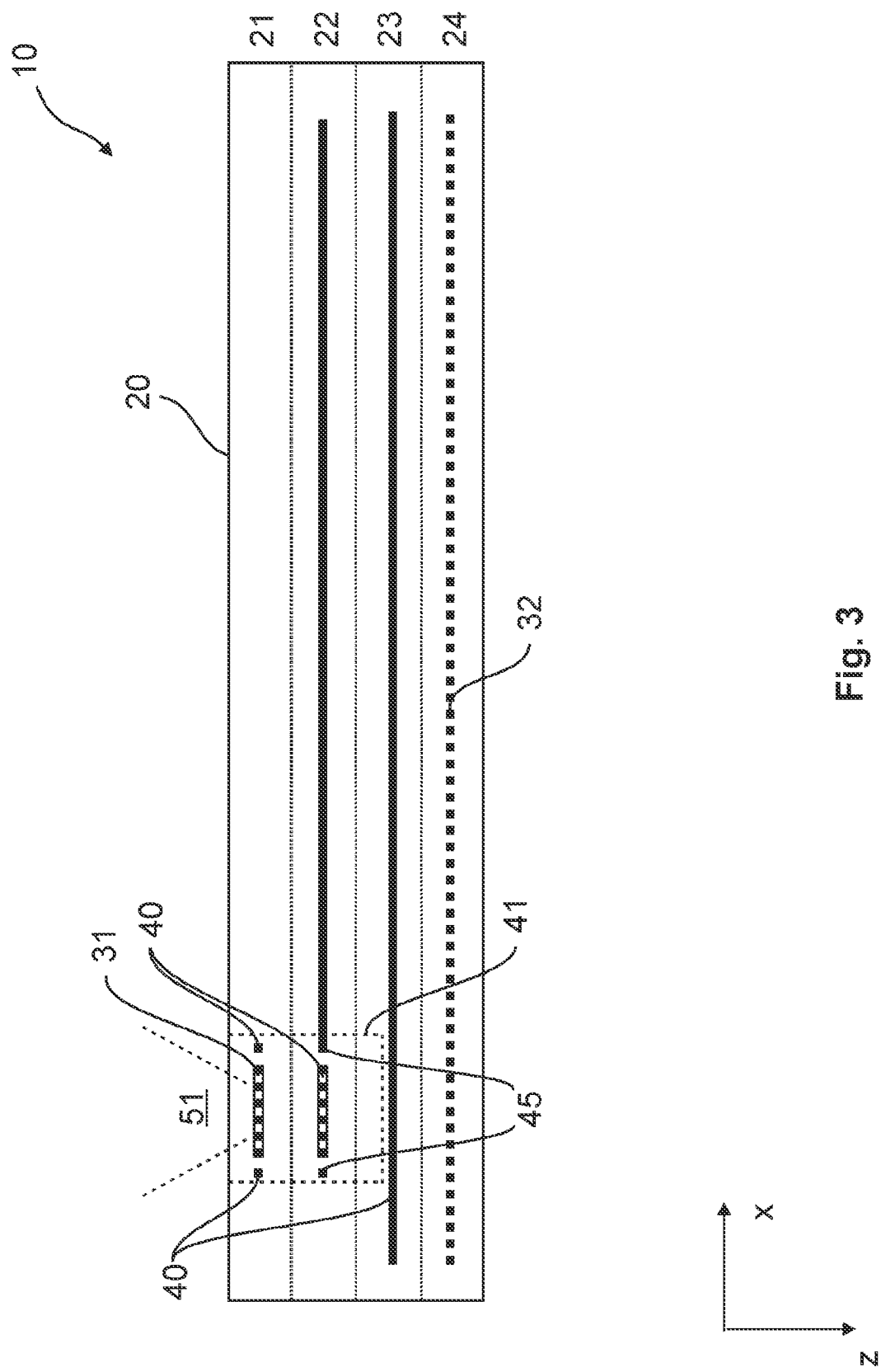
Figure 6:
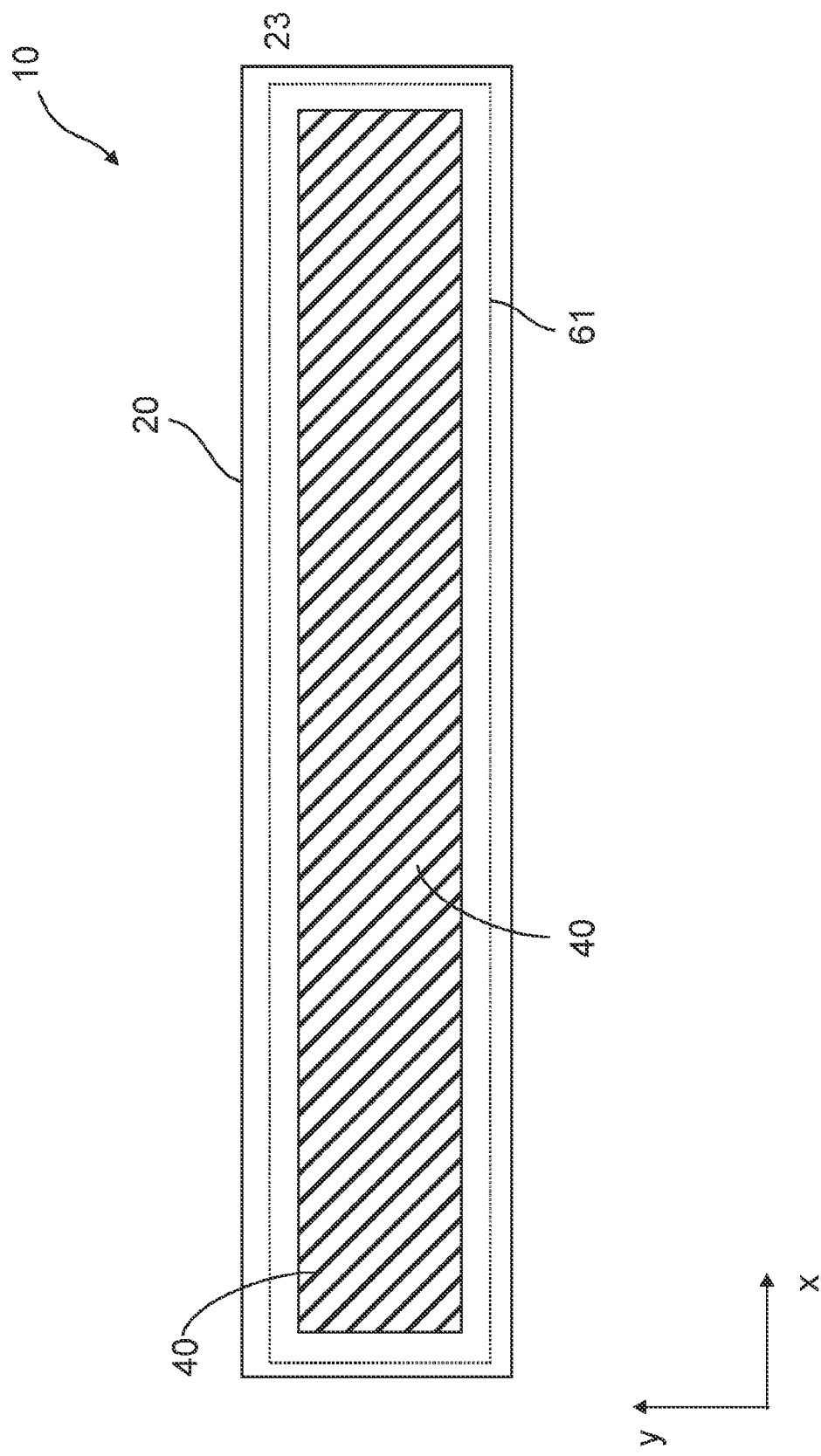
Figure 7:
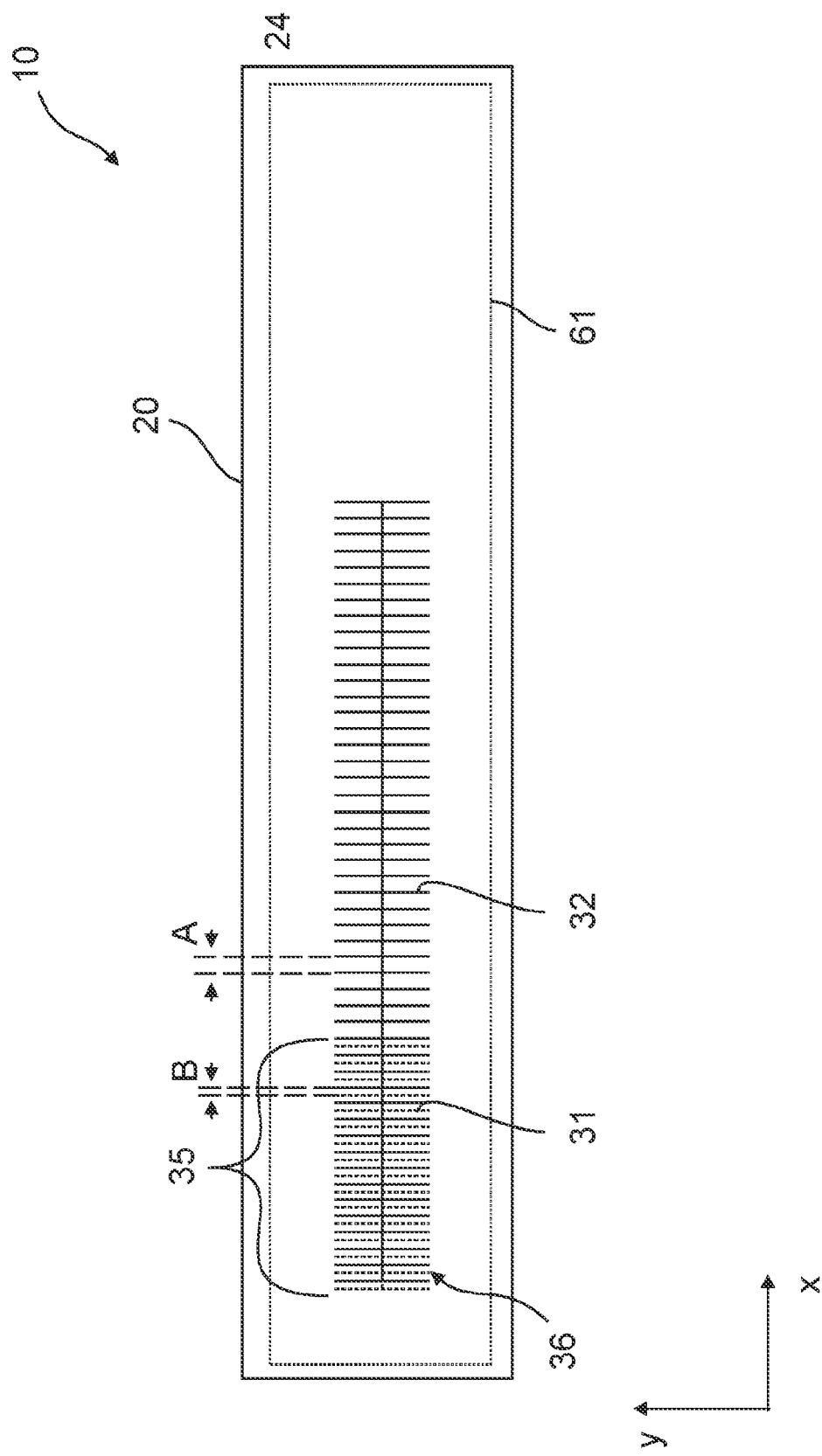
Figure 8:
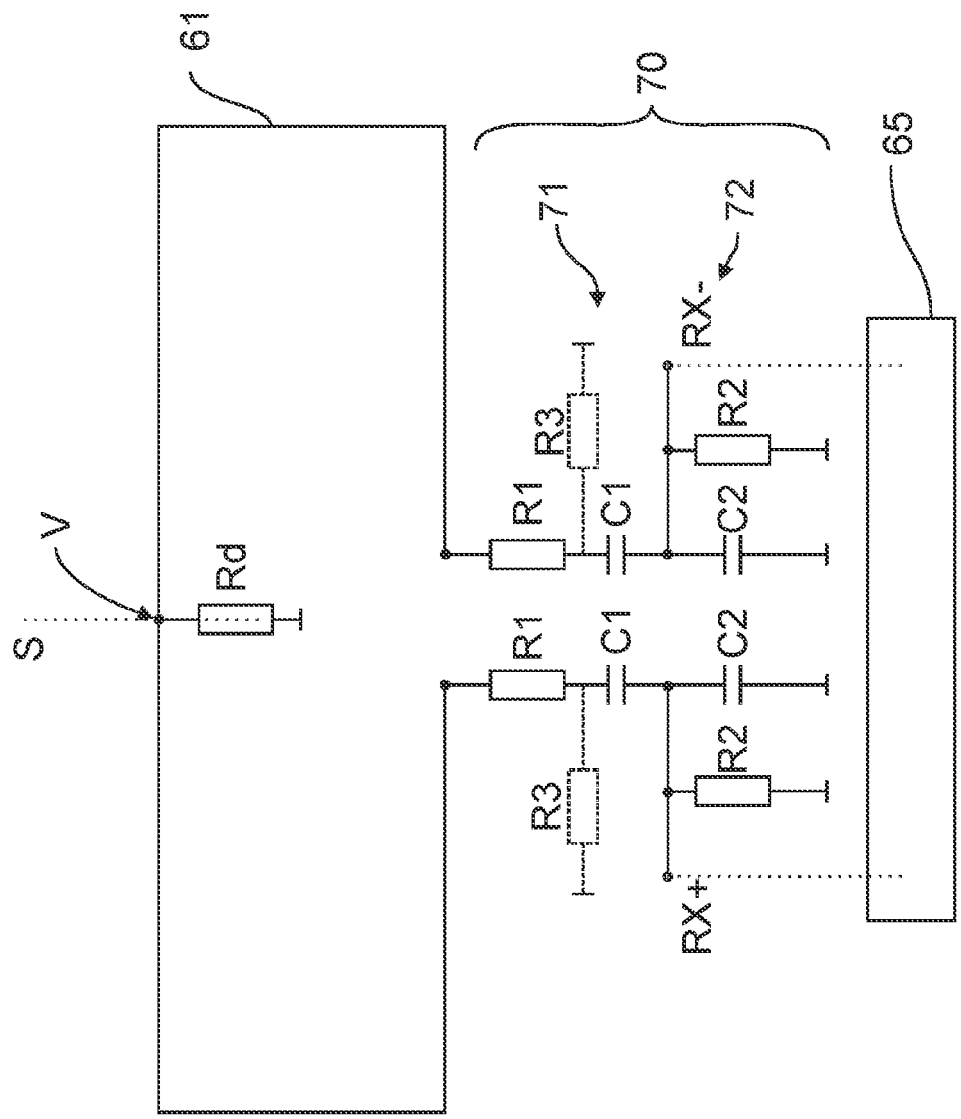

Further advantages, features and details of the invention will be apparent from the following description, in which embodiments of the invention are described in detail with reference to the drawings. In this connection, the features mentioned in the claims and in the description may each be essential to the invention individually or in any combination. They show:

FIG. 1 a schematic side view of a vehicle with a device according to the invention, FIG. 2 a schematic lateral sectional view of a door handle with a device according to the invention of the vehicle in FIG. 1, which corresponds in perspective to a top view of the vehicle, FIG. 3 an enlarged side view of the device according to the invention in FIG. 2, FIGS. 4-7 schematic sectional views of various positions of the device according to the invention in FIGS. 2 and 3, FIG. 8 a schematic diagram of parts of a device according to the invention.

In the following figures, the identical reference signs are used for the same technical features even of different embodiments.

FIG. 1 shows a vehicle 1 with a door handle 5 according to the invention. The door handle 5 can here form a vehicle part 5 which has a device 10 according to the invention. The door handle 5 is attached to a door 2 of the vehicle 1 to open the door 2 by a manual opening process. To do this, a user can reach into a door handle recess 7 shown in FIG. 2 and pull on the door handle 5. For the opening process, it is necessary that a lock of the door 2 is unlocked. For this purpose, the engagement with the door handle recess 7 can be detected as an activation action to activate authentication and—if authentication is successful—unlocking as a function of the vehicle 1. Locking can be activated as another function of the vehicle 1 if the approach into a detection area 51 is detected as an activation action. Of course, these are only examples of functions and activation actions. In the case of a flush door handle 5, the function of the vehicle 1 can be, for example, the opening process itself, which is performed automatically. It is also conceivable that a device 10 according to the invention is arranged in the rear or front area, so that the function is the opening process of a flap 6 of the vehicle 1.

FIG. 1 shows a side view of the vehicle 1, with the mutually orthogonal directions x and y indicated. In FIG. 2, a perspective top view of the vehicle 1 corresponding to the mutually orthogonal directions x and z is used. The representation in FIG. 2 (and also in FIG. 3) corresponds in perspective to a side view of the door handle 5 or of the device 10 according to the invention and the layers 21, 22, 23, 24. In FIGS. 4 to 7, on the other hand, sectional views of the device 10 are shown which result in perspective from a top view of the device 10, and thus again correspond to the side view of the vehicle 1 in FIG. 1. The geometric relationships discussed in the context of the present invention (e.g., the congruent formation and positioning of the shielding and sensor elements 40, 31 and of the ground area 45 of various layers 21, 22, 23, 24) may thereby be described with respect to this imaginary top view of the device 10 according to the invention. This top view may be defined as a view in the axial direction z, which is orthogonal to the longest extension of the layers 21, 22, 23, 24 and to the lateral directions x and y, respectively.

As shown in FIG. 2, the door handle 5 has the device 10 according to the invention, which is used to detect an activation action in a detection area 51, and in particular via the door handle 5 for mounting on the door 5. By means of the device 10, a function of the vehicle 1 can be activated in dependence on the detection.

The device 10 may have a multilayer printed circuit board 20 shown in FIG. 3 with further details, on which at least one electrically conductive sensor element 31 for capacitive detection is arranged in the detection area 51 on a first layer 21 of the printed circuit board 20. The detection area 51 may be implemented as a first detection area 51, which extends outside the vehicle 1 in the region of a first outer side of the door handle 5. Likewise, a second detection area 52 may extend in the region of the door handle recess 7 or a second outer side of the door handle 5. The second outer side may face the door handle recess 7 and the first outer side may face away from the door handle recess 7 (see FIG. 2). It may thus be possible that the sensor element 31—as a first sensor element 31—is provided for capacitive detection in the detection area 51—as a first detection area 51—on the printed circuit board 20. Furthermore, a second sensor element 32 of the device 10 may also be provided at a fourth layer 24, which also performs capacitive detection in the second detection area 52. This enables the detection of different activation actions. The respective sensor element 31, 32 may be configured as a capacitive sensor, so that the detection is based on the fact that a capacitance provided by the respective sensor element 31, 32 changes. The individual sensor element 31, 32 can be understood here as an electrode that forms the variable capacitance with respect to the environment of the vehicle 1. For this purpose, an electrical ground potential of the vehicle 1 can be regarded as a counter electrode to form an imaginary capacitor with the variable capacitance. A first activation action in the first detection area 51 then causes a change in capacitance of the capacitance provided by the first sensor element 31. A second activation action in the second detection area 52 accordingly causes a capacitance change of the capacitance provided by the second sensor element 32.

In order to improve detection, at least two shielding elements 40 can be used for shielding 41 for detection, as shown in FIG. 3. The shielding elements 40 are arranged at different layers 21, 22, 23, 24 of the printed circuit board 20, whereby one of the shielding elements 40 at a first layer 21 surrounds the (first) sensor element 31 to provide the shielding 41 in different directions x, y, z. Shown in FIG. 3 is a "pot shape" of the shielding 41 that can be created by the arrangement of the shielding elements 40 shown. The shielding elements 40 can be arranged distributed on the layers 21, 22, 23, 24 in such a way that the shielding 41 limits the detection area 51 in the three mutually orthogonal directions x, y, z, and predominantly or completely surrounds the detection area 51 in a plane x-y (shown in FIG. 4).

Figure 4:
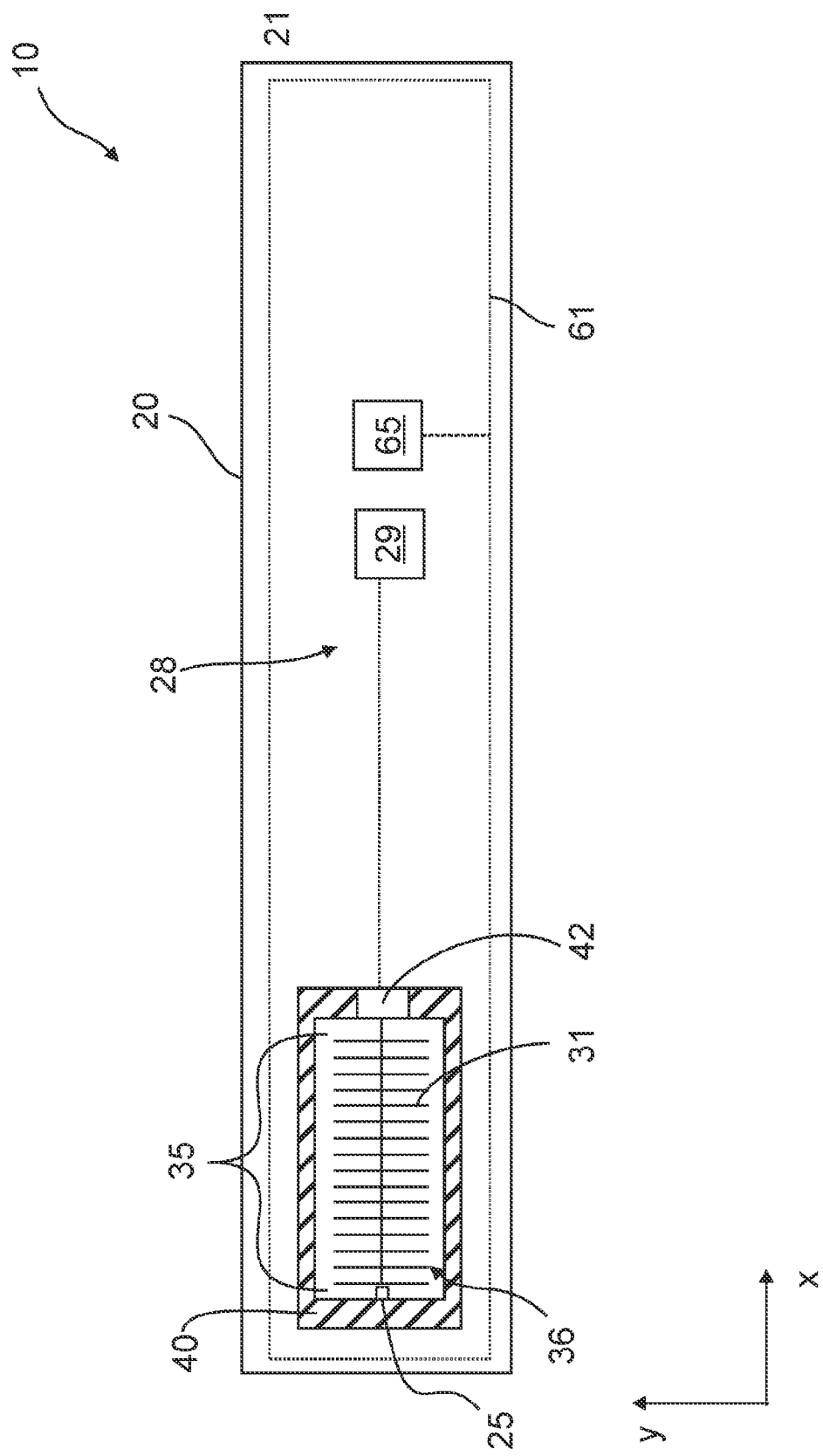
Figure 5:
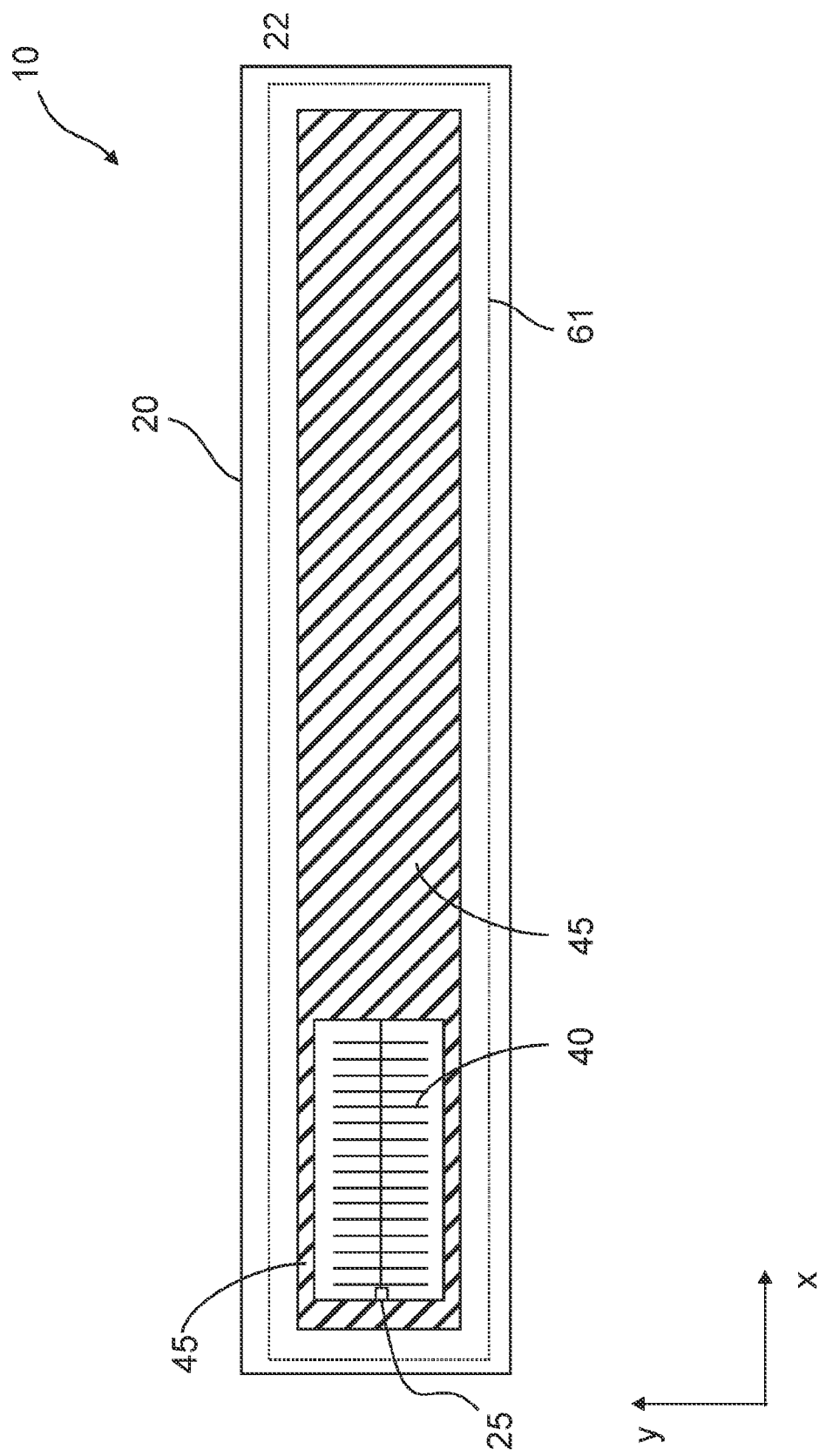

As shown in FIG. 4, the shielding element 40 at the first layer 21 may surround the sensor element 31 predominantly, and possibly even completely (not shown). Specifically, in FIG. 4 it is shown that the sensor element 31 is only predominantly, i.e. partially, surrounded by the shielding element 40. For this purpose, the shielding element 40 has an interruption 42 to avoid an occurrence of short-circuit currents in particular due to an interaction with the communication element 61 during operation for communication, in particular NFC communication. The interruption 42 may be electrically insulated to avoid, in particular, such interference during communication. This ensures that an electric field generated by the sensor element 31 is reliably directed into the detection area 51. To further improve detection in the detection area 51, one of the shielding elements 40 at a second layer 22 can be designed/configured to be congruent with the sensor element 31 at the first layer 21, as shown in FIG. 5. The shielding element 40 at the second layer 22 can accordingly be arranged at least partially congruent and in the same position as the sensor element 31 at the first layer. Here, of course, positionally identical refers only to the directions x and y. In an imaginary top view of the layer 22 in FIG. 5 and the layer 21 below it, the sensor element 31 could thus no longer be visible behind the shielding element 40 on the second layer 22 if the layers 21, 22 are partially transparent, at least for the part for which the shielding element 40 is provided to be congruent.

Referring to FIG. 5, an electrical ground 45 may further extend in a planar manner at the second layer 22 adjacent to the shielding element 40 at the second layer 22, in particular parallel to an area 28 for arranging electronic components at the first layer 21 and/or to one of the shielding elements 40 at a third layer 23. This ground 45 may have a recess for the sensor element 31 at the first layer or for the corresponding shielding element 40 at the second layer 22. Furthermore, the ground 45 may serve to provide interference suppression for the electronic components in the area 28 of the first layer 21. Furthermore, the area of the ground 45 around the recess may be formed to be congruent and/or in the same position as the shielding element 40 at the first layer 21.

In FIG. 6, one of the shielding elements 40 at a third layer 23 is shown extending flatly and unilaterally to the sensor element 31 at the first layer 21 to provide the shielding 41 unilaterally. In addition, this shielding element 40 shown extends even further in the direction x, in order to simultaneously provide the shielding 41 here for the second sensor element 32 in FIG. 7. The shielding element 40 and the second sensor element 32 thus have a longer extension than the first sensor element 31.

In FIG. 7, the sensor element 31 of the first layer 21 is shown dashed to illustrate the position of the sensor element 31 below the fourth layer 24. In order to at least reduce an influence of the first activation action on the detection of the second sensor element 32, it can be provided that the sensor elements 31, 32 as shown in FIG. 7 are at least partially congruent to each other, but are positioned offset to each other. In other words, in addition to the offset arrangement on the different layers 21, 24 of the printed circuit board 20 (in axial direction z), an offset positioning of the sensor elements 31, 32 with respect to each other within the respective layer 21, 24 (in direction x) is provided. Thus, the second sensor element 32 is formed at least partially congruent with the first sensor element 31, but is not arranged congruent (or in the same position). In an imaginary top view of the sensor elements 31, 32 in the axial direction z, the first sensor element 31 would overlap the second sensor element 32 for at least a partial section if the positioning were not offset. However, this overlapping is (at least partially) eliminated with the provided offset positioning. This offset positioning can also be understood in such a way that the congruent areas 35 of the sensor elements 31, 32 are positioned offset to each other in the lateral direction x. As shown by the dashed line in FIG. 7, the first sensor element 31 is offset by the offset B with respect to the second sensor element 32 and is therefore not overlapped. Specifically, in the illustration, the sensor elements 31, 32 each have the same line structure, but the lines do not overlap due to the offset positioning. In this case, the lines are arranged as partial structures 36 of the sensor elements 31, 32 at a distance A from each other. The offset B is approximately or exactly half of the distance A.

In the examples shown, it is provided that the shielding elements 40 at the different layers 21, 22, 23, 24 are connected to each other via through-hole plating 25, and are thus provided with the same potential. Alternatively, the shielding elements 40 can also be electrically separated from each other at the different layers 21, 22, 23, 24 in order to have different electrical potentials. A mixture of separated and connected shielding elements 40 is also conceivable. The connection via through-hole plating 25, however, has the advantage that only one electrical connection of the shielding elements 40 to a processing device 29 is necessary to operate the shielding elements 40 for providing an active shielding 41, in which an electrical potential of the shielding elements 40 is adjusted in dependence on an electrical potential of the sensor element 31 and/or 32. The processing device 29 and/or a processing arrangement 65 for a near-field communication may thereby be arranged in an area 28, in particular at the first layer 21 according to FIG. 4. This area may extend opposite a ground area 45, in particular at the second layer 22.

It is further shown in FIGS. 4 to 7 that a communication element 61 can be arranged on the layers 21, 22, 23, 24 of the printed circuit board 20, and preferably extends over all of the layers 21, 22, 23, 24 at a distance from the sensor and shielding element 31, 40. The communication element 61 is not shown here with its concrete formation on the respective layers 21, 22, 23, 24, but only schematically via a dashed line. The communication element 61 can be formed along this line, but on different layers 21, 22, 23, 24. In other words, the communication element 61 can be interrupted on one of the layers 21, 22, 23, 24 and be continued again as a conductor track via a through-hole plating 25 at this lateral position, but on another layer 21, 22, 23, 24. The communication element 61 may be designed/configured as a near-field antenna to provide near-field communication with a mobile device outer side the vehicle 1. This near-field communication may be triggered by the detection of the activation action to perform an authentication.

FIG. 8 shows an exemplary design/configuration for a communication element 61, in particular an NFC antenna, for near field communication. The device 10 is therefore designed/configured in the present case not only as a sensor device 10, but also as a communication device 10, in which the communication element 61 can be operated by a processing arrangement 65 as a communication interface.

The communication element 61 is in the form of a loop or loop antenna, and may be used to transmit and/or receive signals for near-field communication with a mobile device. The coupling between the communication device 10 and the mobile device may be performed at an operating frequency of the communication element 61 of 13.56 MHz. Accordingly, the communication element 61 may be configured to generate a magnetic field for communicating with the mobile device, and in this manner inductively couple with the mobile device. Therefore, the NFC antenna (communication element) 61 may also be understood as an NFC coil. Advantageously, the communication element 61 may be formed as a conductor loop on the printed circuit board 20. However, the shape shown in FIG. 8 does not extend continuously on a single layer of the circuit board 20 in the manner shown. Rather, this shape is interrupted at some locations by through-hole plating 25 and, starting from this interruption, continues at another layer. If the course of the communication element 61 on all layers 21, 22, 23, 24 were brought together in one plane, the course shown in FIG. 8 could thus be obtained.

It is clear from FIG. 8 that the shape of the communication element 61 shown is geometrically symmetrical (with respect to the virtual ground V through which the corresponding axis of symmetry S can pass). This geometrical symmetry has the effect of reducing interference. At the same time, the communication element 61 can be operated according to an electrical symmetry in which the control and/or signal routing by the processing arrangement 65 can be performed symmetrically or differentially via the two branches at $RX_+$ and $RX_-$ (as opposed to operation in which one of the terminals of the communication element 61 is connected to ground). Advantageously, therefore, an electrical signal, in particular a voltage not equal to 0 volts, can be measured at each of the two terminals $RX_+$ and $RX_-$, which comprises information of the near-field communication. The voltage at the connections $RX_+$ and $RX_-$ can be symmetrical and thus of equal magnitude. The processing arrangement 65 is designed/configured, for example, as an NFC receiver or transceiver.

In the symmetrical design/configuration shown, a virtual ground may be located precisely or substantially at the virtual ground V of the communication element 61. This virtual ground V may be located at the half-length or center location of the communication element 61, as shown in FIG. 8. Depending on the antenna design/configuration, it may be possible that no current flows through a tap at this virtual ground V connected to ground in an ideal antenna. This virtual ground V is therefore referred to as virtual ground in the following.

The geometric and electrical symmetry can already reduce interference in the form of disturbing immissions (electromagnetic radiation). Nevertheless, interfering effects remain which cause parasitic oscillating circuits of the communication medium 61 to be excited. In this case, harmonic and non-harmonic oscillations can arise, whereby the non-harmonic oscillations may be reduced by the processing arrangement 65 and/or by a filter arrangement 70. Nevertheless, the harmonic oscillations are still disturbing, and may impair reception during near-field communication by the communication element 61.

In order to further reduce interference during reception of the near-field communication due to interfering immissions, in particular EMC irradiation, resistive damping can be provided at the position of the (ideal) virtual ground V. That is, at this position, a resistive resistor or impedance can be used as a damping resistor Rd connecting the communication element 61 to an electrical ground potential. This damping resistor Rd may be implemented as a low resistance, for example, in the range of 50 to 100 Ohms. Functionally, the resistive damping by the damping resistor Rd can cause the disturbing oscillations to be damped by the resistor Rd even when the position of the virtual ground on the communication element 61 changes due to the occurrence of the disturbances.

In addition, for further stabilization of the system, it can be provided that the communication element 61 is arranged at least predominantly parallel to the outer edge and/or at a constant distance from the electrical ground 45, in particular ground area 45, on the printed circuit board 20. In FIG. 5, the ground 45 is in the form of a conductor surface with ground potential. In FIG. 5, the constant distance between the ground area 45 and the communication element 61 can also be seen. In this way, it can be ensured that a magnetic coupling of the communication element 61 to the ground 45 is the same at every position.

In addition, a bandpass filter, preferably 2nd order, in particular a so-called Wien filter, can be used for the filter arrangement 70, which provides improved filtering out of the interference due to a particularly steep bandpass curve. The Wien filter is a specially switched RC bandpass, and is also known as the frequency-determining circuit in a Wien-Robinson generator.

FIG. 8 shows that the filter arrangement 70 can be composed of at least one high pass arrangement 71 (in particular a 1st order RC filter) and at least one low pass arrangement 72 (in particular also as a 1st order RC filter). The high pass and low pass arrangements 71, 72 may combine in pairs to form the bandpass filter, in particular a 2nd order RC filter. This bandpass filter, in particular the Wien filter, can be provided symmetrically with the filter arrangement 70.

Specifically, a resistor R1 and a capacitor C1 can be provided in series connection. Optionally, another resistor R3 is provided, which forms an additional voltage divider with R1. Furthermore, a resistor R2 and a capacitor C2 can be connected in parallel.

Furthermore, it can be seen in FIG. 8 that the described filter arrangement 70 has the bandpass filter symmetrically for the connections $RX_+$ and $RX_-$. A possible value for the respective resistor R1 is in the range of 1 to 10 kOhm, for the respective resistor R3 between 1 and 5 kOhm, for the respective capacitor C1 between 1 and 20 pF, for the respective resistor R2 between 100 and 500 ohms and for the respective capacitor C2 between 10 and 40 pF. Thus, at least one bandpass filter can be provided by the filter arrangement 70, which causes a significant attenuation of signals of the communication element 61 in the range of, for example, 100 to 160 MHz.

The foregoing explanation of the embodiments describes the present invention exclusively in the context of examples. Of course, individual features of the embodiments may be freely combined with one another, provided that this is technically expedient, without departing from the scope of the present invention.

LIST OF REFERENCE SIGNS

1 Vehicle
2 Door
5 Door handle, vehicle part
6 Tailgate
7 Door handle recess
10 Device, sensor and/or communication device
20 Printed circuit board
21 First layer
22 Second layer
23 Third layer
24 Fourth layer
25 Through-hole plating
28 Electronics components area
29 Processing device
31 Sensor element, first sensor element
32 Second sensor element
35 Congruent areas
36 Partial structure, line structure
40 Shielding element
41 Shielding
42 Interruption
45 Ground
51 Detection area, first detection area
52 Second detection area
61 Communication element, antenna, NFC loop
65 Processing arrangement
70 Filter arrangement
71 High pass arrangement
72 Low pass arrangement
x First direction, lateral direction
Second direction, lateral direction
Y
z Third direction, axial direction
21, 22, 23, 24 Layers A Distance, minimum distance
B Offset
C Capacitor
R Resistance
Rd Damping resistance
RX Connection
V Virtual ground
S Symmetry axis

The invention claimed is:

1. A device for a vehicle for detecting an activation action in at least two different detection areas in order to activate at least one function of the vehicle as a function of the detection:
  a printed circuit board having a plurality of layers arranged one above the other in an axial direction,
  a first electrically conductive sensor element for capacitive detection in a first of the detection areas,
  a second electrically conductive sensing element for capacitive sensing in a second of the detection areas,
wherein the sensor elements are arranged on different ones of the layers of the printed circuit board,
  wherein
  the sensor elements are configured to be at least partially congruent, the congruent areas of the sensor elements being positioned offset with respect to one another in a lateral direction, and
  the congruent areas of the sensor elements have identically formed partial structures and wherein with respect to the lateral direction, the substructures of the second sensor element are arranged between the substructures of the first sensor element.

2. The device according to claim 1,
wherein
the sensor elements each have a partial structure which is repeated at least at a certain minimum distance in the lateral direction.

3. The device according to claim 2,
wherein
the offset positioning of the sensor elements is provided with a specific offset which corresponds at most to half the minimum distance of the substructures.

4. The device according to claim 2,
wherein
the offset positioning of the sensor elements taking place in the same lateral direction.

5. The device according to claim 1,
wherein
the offset positioning is implemented as a different positioning of the sensor elements within the respective layer, so that an overlapping of the sensor elements is prevented.

6. The device according to claim 5,
wherein
electric fields generated by the sensor elements are formed offset.

7. The device according to claim 1,
wherein
the second sensor element has a longer extension than the first sensor element, so that the second detection area is configured to be larger than the first detection area.

8. The device according to claim 1,
wherein
a shielding element is provided on a second layer of the printed circuit board, and has at least partially a congruent configuration with the first sensor element on a first layer of the printed circuit board and at least partially with the second sensor element on a further layer of the printed circuit board, and is positioned in the same position in the lateral direction as the first sensor element and offset with respect to the second sensor element.

9. The device according to claim 1,
wherein
a processing device is arranged on the printed circuit board and is electrically connected for charge transfers to the sensor elements in order to evaluate a variable electrical capacitance of the respective sensor element on the basis of the charge transfers and thereby provide the respective capacitive detection.

10. The device according to claim 9,
wherein
the processing device is configured to carry out the detection of the activation action in such a way that at least an approach or a gesture of a user is detected on the basis of the evaluation of the respective capacitance, and a distinction is made between a first activation action in the first detection area and a second activation action in the second detection area.

11. The device according to claim 9,
wherein
the first sensor element is formed at a first layer adjacent to the first detection area, and the second sensor element is formed at a further layer adjacent to the second detection area, the respective layers being provided as outer layers of the printed circuit board in order to form the detection areas by the sensor elements on different sides of a door handle of the vehicle via the respective variable electric capacitance of the sensor elements, so that a first activation action in the first detection area is distinguished from a second activation action in the second detection area on the basis of the capacitances in order to activate different functions of the vehicle according to the distinction.

12. The device according to claim 1,
wherein
a communication element is arranged on the layers of the printed circuit board.

13. The device according to claim 12,
wherein
a communication element extends over all of the layers at a distance from the sensor elements in order to provide near-field communication with a mobile device outer side the vehicle, and in order to carry out an authentication via the near-field communication triggered by the detection of the activation action, and in order to activate the at least one function of the vehicle, at least an unlocking or locking of the vehicle, depending on the authentication.

14. The device according to claim 1,
wherein
the staggered positioning of the sensor elements is implemented as a different positioning of the sensor elements in the lateral direction in such a way that a disturbance by the capacitive detection of the first sensor element in the first detection area is reduced to the capacitive detection of the second sensor element in the second detection area.

15. The device according to claim 1,
wherein
the respective congruent region of the sensor elements has a repeating substructure which is configured to form an electric field for the respective capacitive detection and is at least aligned or arranged in such a way that an interfering interaction with a communication element of the printed circuit board is reduced.

16. A door handle for a vehicle, which as the vehicle part comprises a device according to claim 1.

17. The device according to claim 1, wherein
the identically formed partial structures are in the form of a line structure.

18. A device for a vehicle for detecting an activation action in at least two different detection areas in order to activate at least one function of the vehicle as a function of the detection:
   a printed circuit board having a plurality of layers arranged one above the other in an axial direction,
   a first electrically conductive sensor element for capacitive detection in a first of the detection areas,
   a second electrically conductive sensing element for capacitive sensing in a second of the detection areas,
   wherein the sensor elements are arranged on different ones of the layers of the printed circuit board,
   wherein the sensor elements are configured to be at least partially congruent, the congruent areas of the sensor elements being positioned offset with respect to one another in a lateral direction,
   wherein a shielding element is provided on a second layer of the printed circuit board, and has at least partially a congruent configuration with the first sensor element on a first layer of the printed circuit board and at least partially with the second sensor element on a further layer of the printed circuit board, and is positioned in the same position in the lateral direction as the first sensor element and offset with respect to the second sensor element.

19. A device for a vehicle for detecting an activation action in at least two different detection areas in order to activate at least one function of the vehicle as a function of the detection:
   a printed circuit board having a plurality of layers arranged one above the other in an axial direction,
   a first electrically conductive sensor element for capacitive detection in a first of the detection areas,
   a second electrically conductive sensing element for capacitive sensing in a second of the detection areas,
   wherein the sensor elements are arranged on different ones of the layers of the printed circuit board,
   wherein the sensor elements are configured to be at least partially congruent, the congruent areas of the sensor elements being positioned offset with respect to one another in a lateral direction,
   wherein a processing device is arranged on the printed circuit board and is electrically connected for charge transfers to the sensor elements in order to evaluate a variable electrical capacitance of the respective sensor element on the basis of the charge transfers and thereby provide the respective capacitive detection,
   wherein the processing device is configured to carry out the detection of the activation action in such a way that at least an approach or a gesture of a user is detected on the basis of the evaluation of the respective capacitance, and a distinction is made between a first activation action in the first detection area and a second activation action in the second detection area.

20. A device for a vehicle for detecting an activation action in at least two different detection areas in order to activate at least one function of the vehicle as a function of the detection:
   a printed circuit board having a plurality of layers arranged one above the other in an axial direction,
   a first electrically conductive sensor element for capacitive detection in a first of the detection areas,
   a second electrically conductive sensing element for capacitive sensing in a second of the detection areas,
   wherein the sensor elements are arranged on different ones of the layers of the printed circuit board,
   wherein the sensor elements are configured to be at least partially congruent, the congruent areas of the sensor elements being positioned offset with respect to one another in a lateral direction,
   wherein a processing device is arranged on the printed circuit board and is electrically connected for charge transfers to the sensor elements in order to evaluate a variable electrical capacitance of the respective sensor element on the basis of the charge transfers and thereby provide the respective capacitive detection,
   wherein the first sensor element is formed at a first layer adjacent to the first detection area, and the second sensor element is formed at a further layer adjacent to the second detection area, the respective layers being provided as outer layers of the printed circuit board in order to form the detection areas by the sensor elements on different sides of a door handle of the vehicle via the respective variable electric capacitance of the sensor elements, so that a first activation action in the first detection area is distinguished from a second activation action in the second detection area on the basis of the capacitances in order to activate different functions of the vehicle according to the distinction.

21. A device for a vehicle for detecting an activation action in at least two different detection areas in order to activate at least one function of the vehicle as a function of the detection:
   a printed circuit board having a plurality of layers arranged one above the other in an axial direction,
   a first electrically conductive sensor element for capacitive detection in a first of the detection areas,
   a second electrically conductive sensing element for capacitive sensing in a second of the detection areas,
   wherein the sensor elements are arranged on different ones of the layers of the printed circuit board,
   wherein the sensor elements are configured to be at least partially congruent, the congruent areas of the sensor elements being positioned offset with respect to one another in a lateral direction,
   wherein the staggered positioning of the sensor elements is implemented as a different positioning of the sensor elements in the lateral direction in such a way that a disturbance by the capacitive detection of the first sensor element in the first detection area is reduced to the capacitive detection of the second sensor element in the second detection area.

* * * * *